(12) United States Patent
Harman

(10) Patent No.: US 6,329,937 B1
(45) Date of Patent: Dec. 11, 2001

(54) ROBUST DATA COMMUNICATIONS USING MULTIPLE SPECTRAL IMAGES

(75) Inventor: Dale Douglas Harman, Freehold, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/372,332

(22) Filed: Aug. 11, 1999

(51) Int. Cl.[7] ........................................ H03M 1/06

(52) U.S. Cl. ............................................ 341/118; 341/144
(58) Field of Search ...................... 341/118, 144

Primary Examiner—Brian Young
(74) Attorney, Agent, or Firm—John P. Veschi

(57) ABSTRACT

In a first embodiment, a data transmitter according to the invention includes a digital-to-analog converter adapted to receive an input signal and produce a plurality of images therefrom, each image being displaced from the other images in frequency, and a compensation filter adapted to compensate at least one of the plurality of images to adjust for a loss inherent in the digital-to-analog converter. In an alternative embodiment, a receiver includes an analog-to-digital converter adapted to receive a line signal comprising a plurality of frequency diverse images, and to produce a sampled signal representative of a single image therefrom. In another alternative embodiment, a method of transmitting a signal includes the steps of creating a plurality of images of a main signal, compensating at least one of the images, and outputting the images. In yet another embodiment, a method of receiving a signal includes the steps of receiving a plurality of images, and processing the plurality of images so that an uncorrupted portion of one image compensates for a corrupted portion of another image.

28 Claims, 5 Drawing Sheets

ROBUST DATA COMMUNICATIONS USING MULTIPLE SPECTRAL IMAGES

FIELD OF THE INVENTION

The invention is directed to the field of communications, and in particular to the field of data communications.

BACKGROUND OF THE INVENTION

Data communication normally occurs on a network that is optimized for data transmission and is therefore physically adapted to be relatively immune to interference. However, some modern data communication scenarios overlay existing media and therefore may incorporate physical limitations dictated by the media. For example, one method of internetworking home computing or communication devices, such as multiple personal computers and peripherals, is to take advantage of the existing home telephone wiring system, which typically includes a network of wires to virtually every room in the house. This method is described, for example, by the presently active Home Phoneline Network Alliance (HomePNA) special interest group in its current version one (V1.x) standard, and its pending version two (V2.x) standard.

A limitation dictated by the advantageous use of the telephone lines within the home as a data network is that the telephone lines were not originally put in place to optimize data communications. Thus, the number and nature of bridge taps (associated with the connection of a telephone or another appliance to the network) are not readily controlled, as they vary with respect to the number of devices coupled to the network and the length of line associated with each bridge tap. Further, since each user's home can be different, a HomePNA system is preferably functional in a diverse set of environments. The chaotic set of environments within which a HomePNA system may function makes it difficult to configure a single system that will function properly in all, or most, environments. For example, each bridge tap, given the physics associated with the connection of a device to the network and the associated line length, may yield a spectral null within an important part of the transmission spectrum. For a typical V2.x application, for example, bridge tap line lengths of fifteen to thirty-five feet will yield tap-induced spectral nulls within the 4–10 MHz band of interest. In addition to these tapp. induced spectral nulls, specific spectral nulls may be intentionally created to minimize interference with other communication media, such as ham radios.

These spectral nulls, however, may create a problem if one of them coincides, in the frequency domain, with a significant portion of a data transmission. Conventionally, a decision feedback equalized (DFE) is employed to recognize and correct for the signal loss associated with the transmission of data in a null. However, a DFE used in this manner leads to a complicated system that is difficult to start up (i.e., to converge for data recovery purposes). What is needed is a simplified receiver design that enables successful data transmission in the presence of spectral nulls, and in particular, in the presence of an unknown quantity and position of such nulls.

SUMMARY OF THE INVENTION

According to the invention, multiple images of the same signal are generated at different frequencies to provide coverage over multiple frequency bands. At a receiving node, the multiple images are combined by the sampling of a digital receiver. The resulting composite baseband signal is robust in the presence of spectral nulls, such as those created by bridge taps. A system based on the inventive concept is easy to start up and achieves reliable performance in the presence of spectral nulls and single tone interference.

In a first embodiment, a data transmitter according to the invention includes a digital-to-analog converter adapted to receive an input signal and produce a plurality of images therefrom, each image being displaced from the other images in frequency, and a compensation filter adapted to compensate at least one of the plurality of images to adjust for a loss inherent in the digital-to-analog converter. In an alternative embodiment, a receiver includes an analog-to-digital converter adapted to receive a line signal comprising a plurality of frequency diverse images, and to produce a sampled signal representative of a single image therefrom. In another alternative embodiment, a method of transmitting a signal includes the steps of creating a plurality of images of a main signal, compensating at least one of the images, and outputting the images. In yet another embodiment, a method of receiving a signal includes the steps of receiving a plurality of images, and processing the plurality of images so that an uncorrupted portion of one image compensates for a corrupted portion of another image.

BRIEF DESCRIPTION OF THE DRAWINGS

Objects and advantages of the invention will be apparent to one of skill in the art upon review of the following detailed description in light of the drawing, wherein.

DETAILED DESCRIPTION

Figure 1:
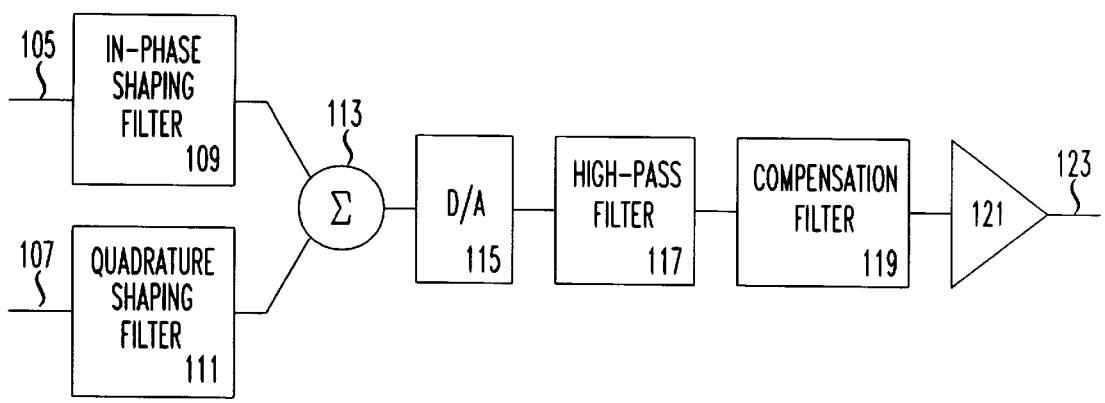
FIG. 1 is a simplified block diagram of a transmitter configured according to the invention.

FIG. 1 is an exemplary transmitter according to the invention. In one exemplary application, the transmitter of FIG. 1 is employed in a HomePNA network, such as within a computer or electronic device communicating via the home phone wires with another device. Data symbols 105 and 107, representing the information to be transmitted to the other device, are supplied respectively to inphase shaping filter 109 and quadrature shaping filter 111 prior to combining at summer 113. Shaping filters 109 and 111 may be, for example, 100% excess bandwidth shaping filters, although tighter excess bandwidths may be employed by one skilled in the art, depending on the application. An exemplary symbol rate for data symbols 105 and 107 is 2.5 MBaud, although this data rate is provided merely by way of example and not of limitation. In practice, any data rate may be employed according to the invention, and it is expected that higher data rates will be employed in the future.

As will be readily understood by one of skill in the art, the front-end portion of the transmitter of FIG. 1 (109–113) is representative of a carrier-less amplitude and phase (CAP) complex transmission scheme. Alternatively, aspects of the invention may be incorporated into a quadrature amplitude modulation (QAM) transmission scheme, in which case a sine modulator and a cosine modulator would respectively be incorporated after the filters 109 and 111. The attributes and relative merits of CAP and QAM are well known to those of skill in the art, and the determination of the modulation scheme is largely one of design choice, as the inventive concepts can be applied to either scheme.

Figure 2:
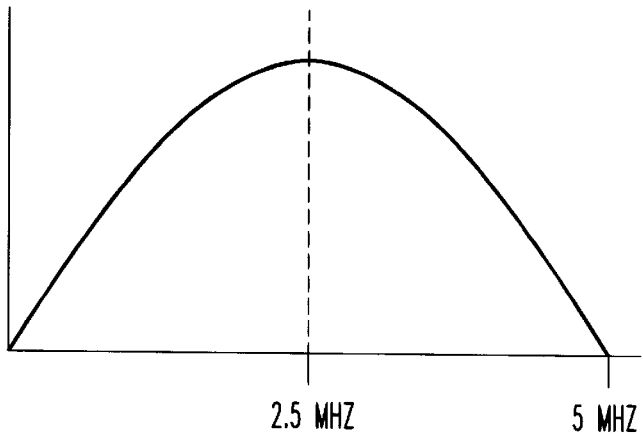
FIG. 2 is an exemplary plot of a real portion of a complex signal existing at an output point of a summer within the transmitter of FIG. 1.
Figure 3:
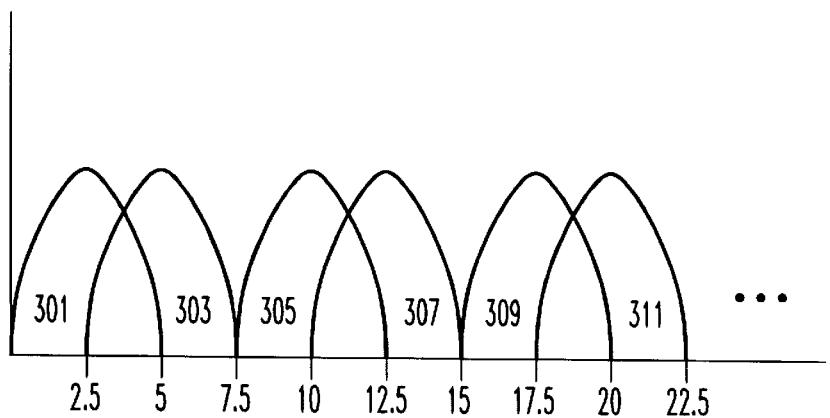
FIG. 3 is an exemplary plot of an output of a digital-to-analog converter within the transmitter of FIG. 1.
Figure 4:
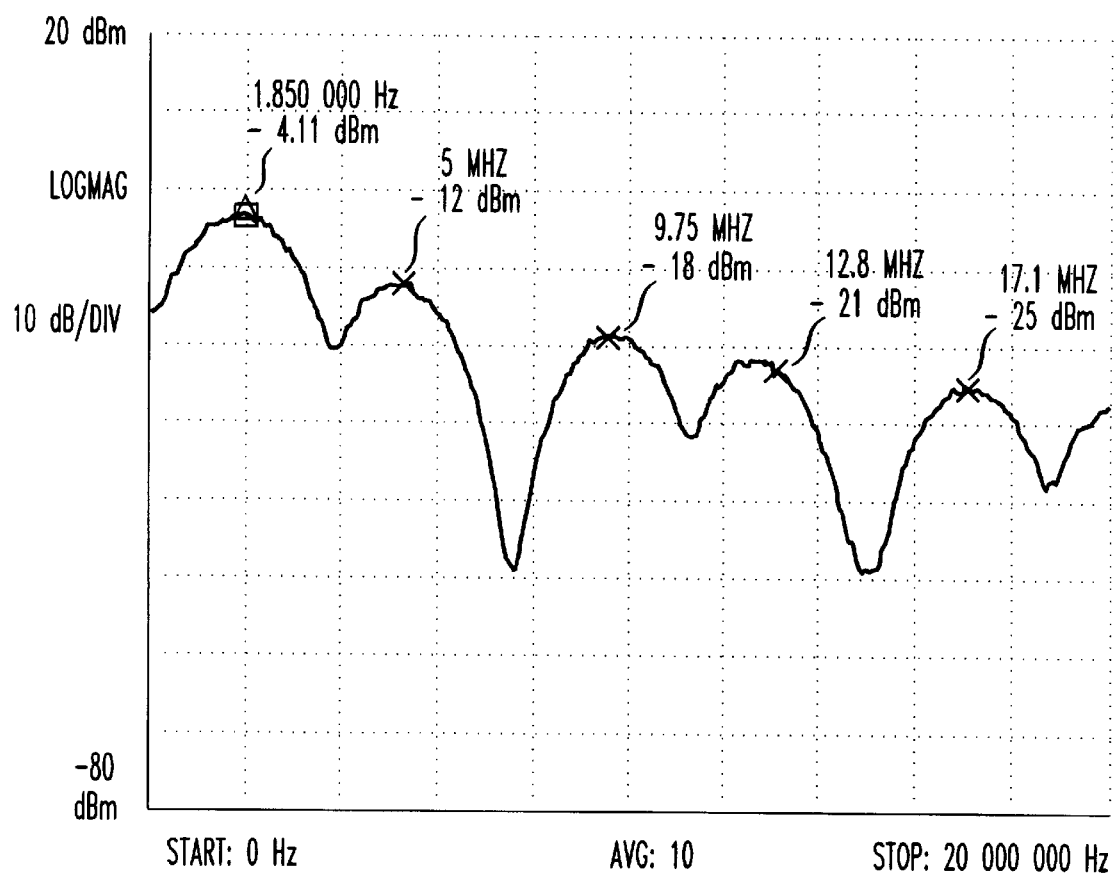
FIG. 4 is an exemplary swept spectrum plot of multiple images corresponding to the data of FIG. 3.

FIG. 2 is an exemplary plot of the real portion of a complex signal at the output of summer 113. This complex signal is provided to digital-to-analog (D/A) converter 115, which has a sampling rate, for example, of 7.5 MHz, or three samples per symbol. The output of D/A converter 115 is shown in FIG. 3. The main signal 301, centered at approximately 2.5 MHz is paired with a second image 303 centered at approximately 5 MHz. A pair of third and fourth images 305 and 307 are respectively centered at approximately 10 and 12.5 MHz, while another pair of fifth and sixth images 309 and 311 are respectively centered at approximately 17.5 and 20 MHz. These three pairs are shown by way of example, although additional images are of course also present at higher frequencies. The relative power of the images 301–311 is shaped by the sampling function of the D/A converter 115, and an exemplary swept spectrum plot of these images is shown in FIG. 4.

Figure 5:
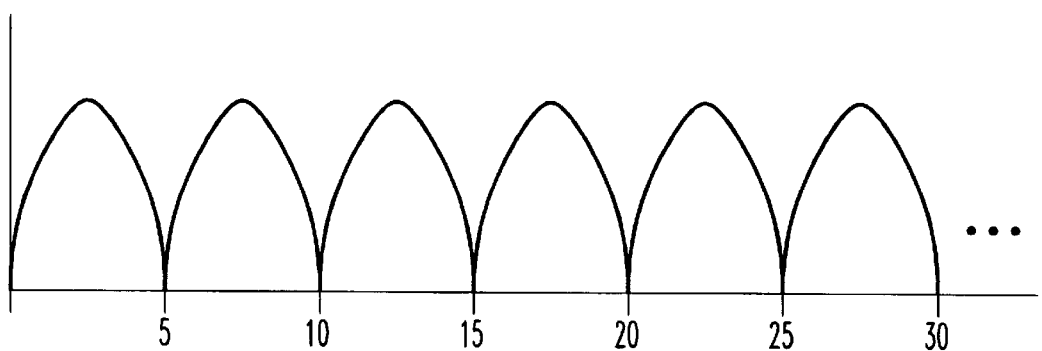
FIG. 5 is an exemplary plot of an alternative output of a digital-to-analog converter within the transmitter of FIG. 1.
Figure 6:
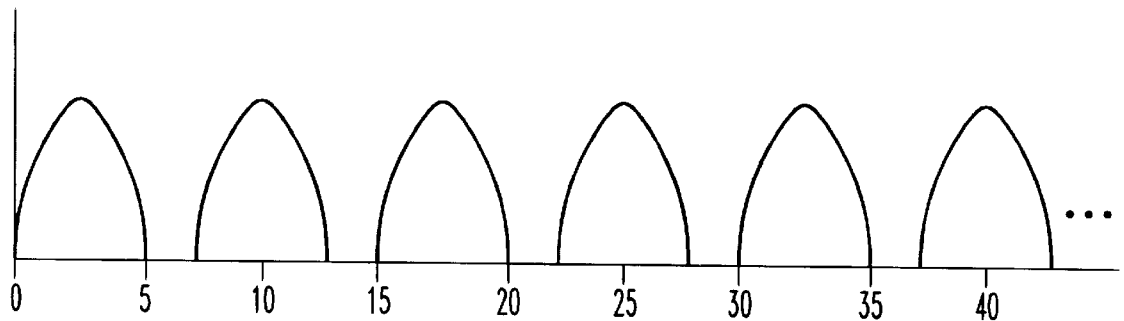
FIG. 6 is an exemplary plot of yet another alternative output of a digital-to-analog converter within the transmitter of FIG. 1.

As with the 2.5 Mbaud symbol rate, the 7.5 MHz sampling rate (T/3) is merely by way of example, and not of limitation. For this example, 10 MHz (T/4), which is shown in FIG. 5, or 15 MHz (T/6), which is shown in FIG. 6, could also be employed. The higher sampling rates may provide improved performance, with respect to any lower frequency images, but may cause some of the higher frequency images to exist in an undesirable region of the frequency spectrum, where they may be subject to federal regulations.

The output of D/A converter 115 may be input to a filter, such as high pass filter 117. High pass filter 117 is particularly useful in the HomePNA environment to remove virtually all energy below a certain level, such as 7 MHz, in order to prevent interference with other lower frequency communications sharing the network, such as Plain Old Telephone Service (POTS), Integrated Services Digital Networks (ISDN), and Asynchronous Digital Subscriber Line (ADSL) services. The use of a filter 117, and the characteristics of such a filter, are largely driven, therefore, by the application and environment in which the invention is employed. In certain environments, it may alternatively be preferable to employ a low pass filter, a bandpass filter, or to not employ a filter at all.

According to the present exemplary embodiment, the filter 117 eliminates the main signal 301 and the first image 303. The remaining images (305–311, etc.) may then be applied to compensation filter 119, which, in the preferred embodiment, is a sin(x)/x compensation filter to compensate for sin(x)/x loss inherent in digital to analog converter 115. Filter 119 is employed to compensate for loss seen by higher order lobes. In one exemplary embodiment, the compensation filter 119 has 7 dB of positive slope from 7 MHz to 22 MHz, and is thus effectively applied to the third through sixth images 305. 311. According to this embodiment, therefore, the main and first image (301,303) are filtered out to eliminate interference with low frequency transmissions, and the third through sixth images (305–311) provide a frequency diverse set of samples to provide increased immunity to error sources such as spectral nulls and single tone interference. This signal is then provided to line driver 121 for output to the transmission medium, such as the home telephone line 123 in the exemplary embodiment.

Figure 7:
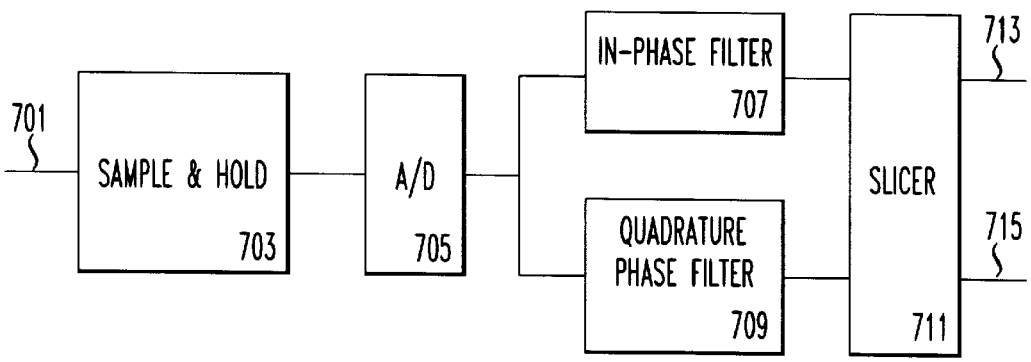
FIG. 7 is a simplified block diagram of a receiver configured according to the invention.
Figure 8:
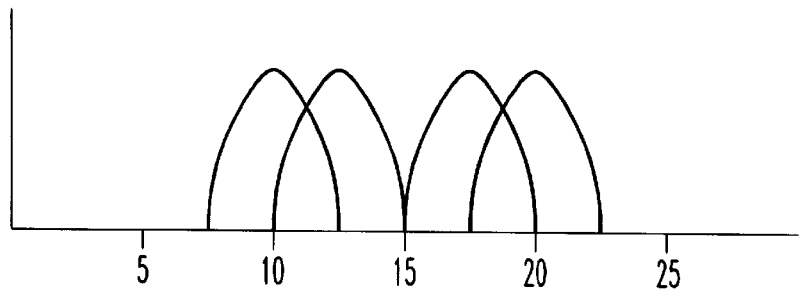
FIG. 8 is an exemplary plot of an exemplary signal received by the receiver of FIG. 7.
Figure 9:
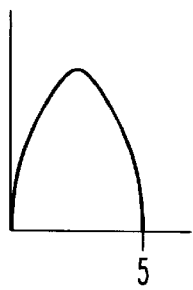
FIG. 9 is an exemplary plot of a sampled signal produced from the received signal of FIG. 8.

A receiver according to the invention, coupled, for example, to a receiving device and the home phone line network in the exemplary embodiment, is shown in FIG. 7. A signal from line 701 is input to sample and hold 703 at a sample rate, such as 7.5 MHz, and digital to analog converter 705 to produce a sampled signal. An exemplary line signal is shown in FIG. 8, including the four high frequency images between 7.5 and 22.5 MHz, and a typical sampled line signal is shown in FIG. 9. The sampled signal is provided to in phase and quadrature filters 707 and 709, which provide filtered signals to a slicer 711 to produce the data on lines 713 and 715.

Figure 10:
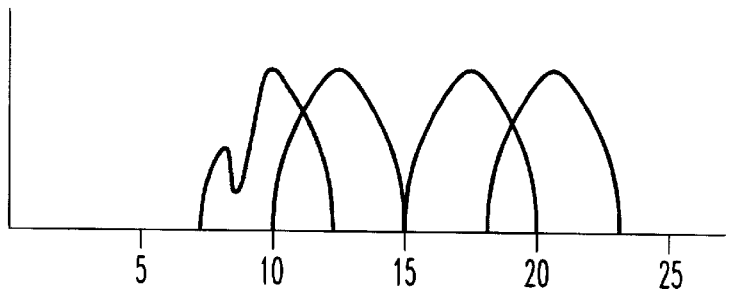
FIG. 10 is an exemplary plot of an alternative signal received by the receiver of FIG. 7.
Figure 11:
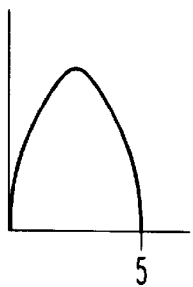
FIG. 11 is an exemplary plot of a sampled signal produced from the received signal of FIG. 10.

As shown in FIGS. 10 and 11, the invention provides a simple and robust scheme for recovering data in the presence of spectral nulls. FIG. 10 shows an exemplary line signal (from line 701) that includes a spectral null at approximately 9 MHz caused by, for example, a bridge tap with a line length of approximately 16.67 feet. However, the sampled line signal in FIG. 11 is the same as the sampled line signal shown in FIG. 9. Thus, the tap-induced spectral null had no impact on the received data signal. In this particular example, the four high frequency images are folded over each other by the sampling process, and since at least one of the other three images (in this case all three of the other images) contains the proper signal at the portion where the null corrupts the first image (the 7.5–12.5 image), then the sampled image is recovered correctly.

Figure 12:
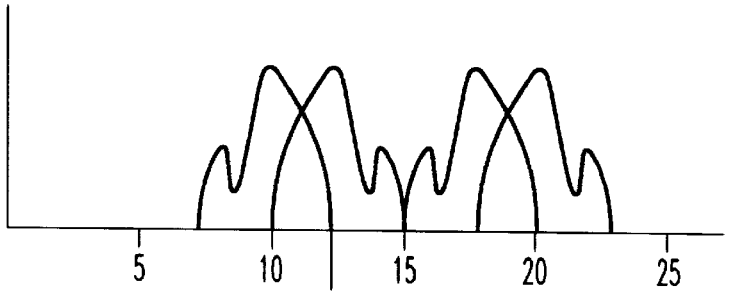
FIG. 12 is an exemplary plot of yet another alternative signal received by the receiver of FIG. 7.
Figure 13:
FIG. 13 is an exemplary plot of a sampled signal produced from the received signal of FIG. 12.
Figure 14:
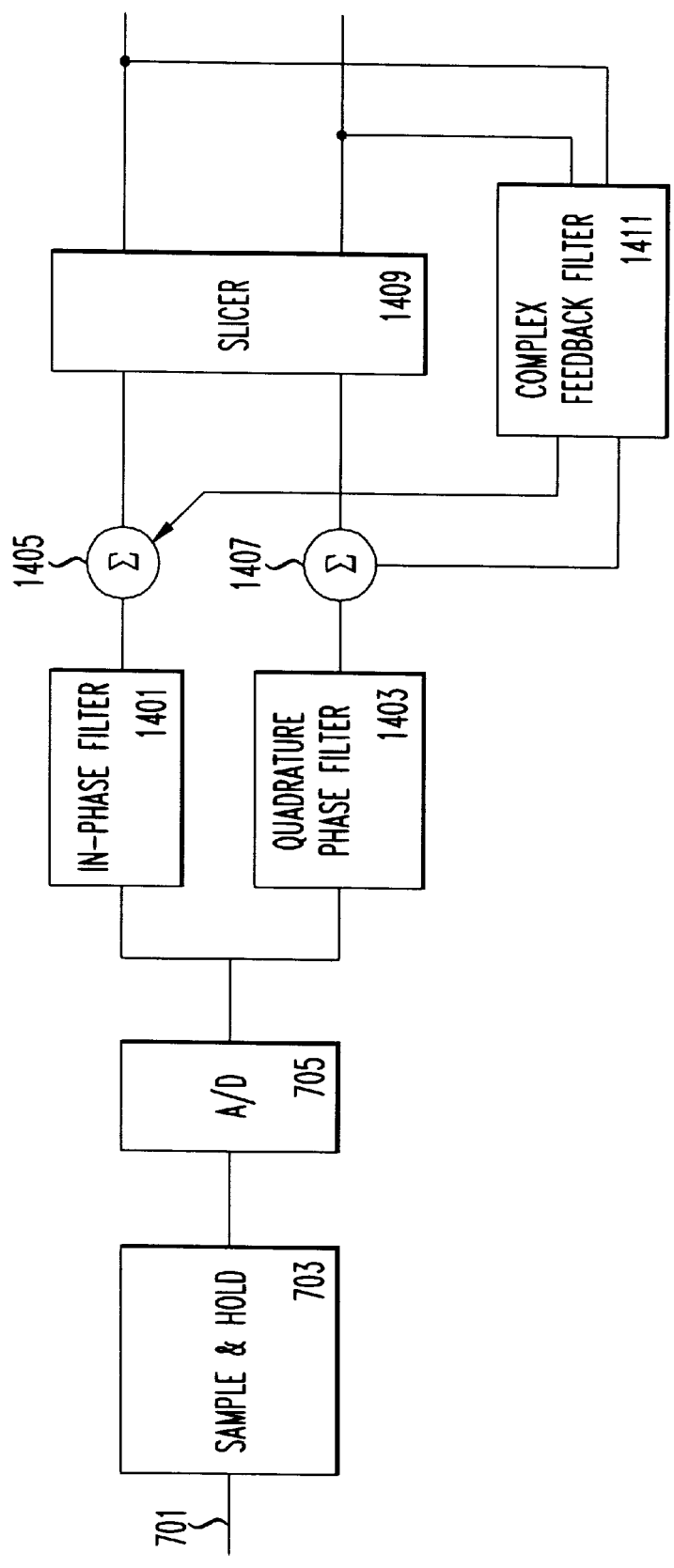
FIG. 14 is a simplified block diagram of an alternative receiver configured according to the invention.

In an alternative example, where all four of the images were unfortunately subject to a null at an overlapping portion, then a complicated DFE may be necessary. For example, the spectral nulls present in the line signal of FIG. 12, when folded upon each other through the sampling process, yield a corrupted signal as shown in FIG. 13. This example demonstrates that the images are folded over each other, and not slid over each other. Thus, the spectral null in the lower portion of the 7.5–12.5 image, such as at approximately 9 MHz, overlaps with the spectral null at the upper portion of the 10–15 image, which is at approximately 13.5 MHz, and also aligns with spectral nulls of 16.5 MHz and 21 MHz for the remaining two images. Thus, in this unfortunate example, the particular spectral nulls, induced, for example, by the taps within a particular user's home, will create a scenario within which data cannot be completely recovered when employing simplest embodiment of the invention.

Fortunately, however, the inventive concept will prove valuable and advantageous in most scenarios, and can be adapted to be compatible with the particular characteristics of a particular environment. For example, as shown in FIG.

14, an alternative receiver includes a decision feedback equalizer in place of the adaptive linear equalizer comprising the filters 707 and 709 of the receiver of FIG. 7. In this alternative, a DFE comprising filters 1401 and 1403, summers 1405 and 1407, slicer 1409 and complex feedback filter 1411 may be employed. This equalizer can equalize signals with notches caused by spectral nulls which cannot be corrected by the first embodiment. However, this alternative embodiment is more difficult to start up and to stabilize.

Thus, according to the invention, alternative embodiments are depicted for employing the concept of the invention in a data transmission scheme to increase the robustness of the data transmission. The particular example of a Home-PNA environment has been used for illustration purposes, although one of skill in the art will clearly recognize that the invention has broad applicability and is not so limited.

What is claimed is:

1. A data transmitter, comprising:
   a digital-to-analog converter adapted to receive an input signal and produce a plurality of signal images therefrom, each signal image being displaced from the other signal images in frequency; and
   a compensation filter adapted to compensate at least one of the plurality of images to adjust for a loss inherent in the digital-to-analog converter.

2. A data transmitter as recited in claim 1, further comprising a filter adapted to filter out at least one of the signal images.

3. A data transmitter as recited in claim 2, wherein the filter is a high pass filter, such that it filters out lower frequency signal images.

4. A data transmitter as recited in claim 3, wherein the lower frequency signal images include a main signal image.

5. A data transmitter as recited in claim 1, further comprising:
   an in-phase shaping filter;
   a quadrature shaping filter; and
   a summer,
      wherein the shaping filters are adapted to receive complex data and produce filtered complex data, and wherein the summer is adapted to receive the filtered complex data and produce the input signal to the digital-to-analog converter.

6. A data transmitter as recited in claim 1, wherein a sampling rate of the digital-to-analog converter is related to a center frequency of a complex data signal.

7. A data transmitter as recited in claim 6, wherein the relationship is such that the sampling rate is a whole number multiple of the center frequency.

8. A data transmitter as recited in claim 7, wherein the whole number is three.

9. A data transmitter as recited in claim 8, wherein the sampling rate is 7.5 MHz and the center frequency is 2.5 MHz.

10. A data transmitter as recited in claim 7, wherein the whole number is four.

11. A data transmitter as recited in claim 7, wherein the whole number is six.

12. A data transmitter as recited in claim 1, further comprising a line driver adapted to receive a compensated signal from the compensation filter and drive the signal to a line.

13. A data transmitter as recited in claim 12, wherein the line is a home telephone line.

14. A data transmitter as recited in claim 13, wherein the home telephone line is part of a HomePNA network.

15. A receiver, comprising:
    an analog-to-digital converter adapted to receive a line signal comprising a plurality of frequency diverse signal images, and to produce a sampled signal representative of a single signal image therefrom.

16. A receiver as recited in claim 15, wherein a sampling frequency of the analog-to-digital converter is related to a main signal from which the plurality of signal images were derived.

17. A receiver as recited in claim 16, wherein the relationship is such that the sampling frequency is a whole number multiple of a center frequency of the main signal image.

18. A receiver as recited in claim 17, wherein the whole number is three.

19. A receiver as recited in claim 18, wherein the sampling rate is 7.5 MHz and the center frequency is 2.5 MHz.

20. A receiver as recited in claim 15, further comprising:
    an in-phase filter;
    a quadrature filter; and
    a slicer,
       wherein the filters are adapted to receive the sampled signal from the analog-to-digital converter and provide complex input to the slicer for use in recovering complex data.

21. A receiver as recited in claim 15, further comprising a decision feedback equalizer adapted to equalize the sampled signal.

22. A receiver as recited in claim 21, wherein the decision feedback equalizer includes a complex feedback filter.

23. A method of transmitting a signal, comprising the steps of:
    creating a plurality of signal images of a main signal;
    compensating at least one of the signal images; and
    outputting the signal images.

24. A method as recited in claim 23, wherein the compensation is an inverse of an effect inherent in the step of creating the plurality of signal images.

25. A method as recited in claim 23, further comprising the step of filtering out a main signal image prior to outputting the signal images.

26. A method of receiving a signal, comprising the steps of:
    receiving a plurality of signal images; and
    processing the plurality of signal images so that an uncorrupted portion of one signal image compensates for a corrupted portion of another signal image.

27. A method as recited in claim 26, wherein the processing comprises folding the signal images upon each other.

28. A method as recited in claim 27, wherein the folding step includes sampling and digitizing.

* * * * *